United States Patent [19]
Aubert

[11] Patent Number: 5,111,147
[45] Date of Patent: May 5, 1992

[54] GRADIENT COIL SYSTEM FOR NMR MACHINES

[75] Inventor: Guy Aubert, Grenoble, France

[73] Assignee: Centre National de la Recherche Scientifique, Paris, France

[21] Appl. No.: 490,603

[22] PCT Filed: Sep. 16, 1988

[86] PCT No.: PCT/FR88/00462
§ 371 Date: Mar. 26, 1990
§ 102(e) Date: Mar. 26, 1990

[87] PCT Pub. No.: WO89/03031
PCT Pub. Date: Apr. 6, 1989

[30] Foreign Application Priority Data
Sep. 28, 1987 [FR] France ............... 87 13350

[51] Int. Cl.$^5$ ............................................. G01R 33/20
[52] U.S. Cl. ....................................... 324/318; 324/309
[58] Field of Search ............... 335/216, 217; 324/300, 324/307, 309, 318, 322, 312, 320, 319

[56] References Cited

U.S. PATENT DOCUMENTS

| | | | |
|---|---|---|---|
| 4,761,612 | 8/1988 | Holland et al. | 324/307 |
| 4,833,434 | 5/1989 | Takechi | 335/217 |
| 4,864,241 | 9/1989 | Goldie | 324/318 |
| 4,876,510 | 10/1989 | Siebold et al. | 324/318 |
| 4,881,032 | 11/1989 | Bottomley et al. | 324/309 |
| 4,881,035 | 11/1989 | Siebold | 324/320 |
| 4,905,316 | 2/1990 | Okamoto | 324/319 |
| 4,910,460 | 3/1990 | Sebok | 324/307 |
| 4,920,316 | 4/1990 | Egloff | 324/318 |
| 4,965,521 | 10/1990 | Egloff | 324/312 |
| 4,980,641 | 12/1990 | Breneman et al. | 324/318 |

FOREIGN PATENT DOCUMENTS 0216590 4/1987 European Pat. Off.
0231879 8/1987 European Pat. Off.

Primary Examiner—Michael J. Tokar
Attorney, Agent, or Firm—Oblon, Spivak, McClelland, Maier & Neustadt

[57] ABSTRACT

In a system of compensated gradient coils, gradient coils mounted on two mandrels coaxial with an examining region of an NMR machine have useful conductors distributed in such a way that when a nomimal current flows through them they induce a zero magnetic vector potential in preferred regions of the space in which the production of undesirable eddy currents is to be prevented.

10 Claims, 3 Drawing Sheets

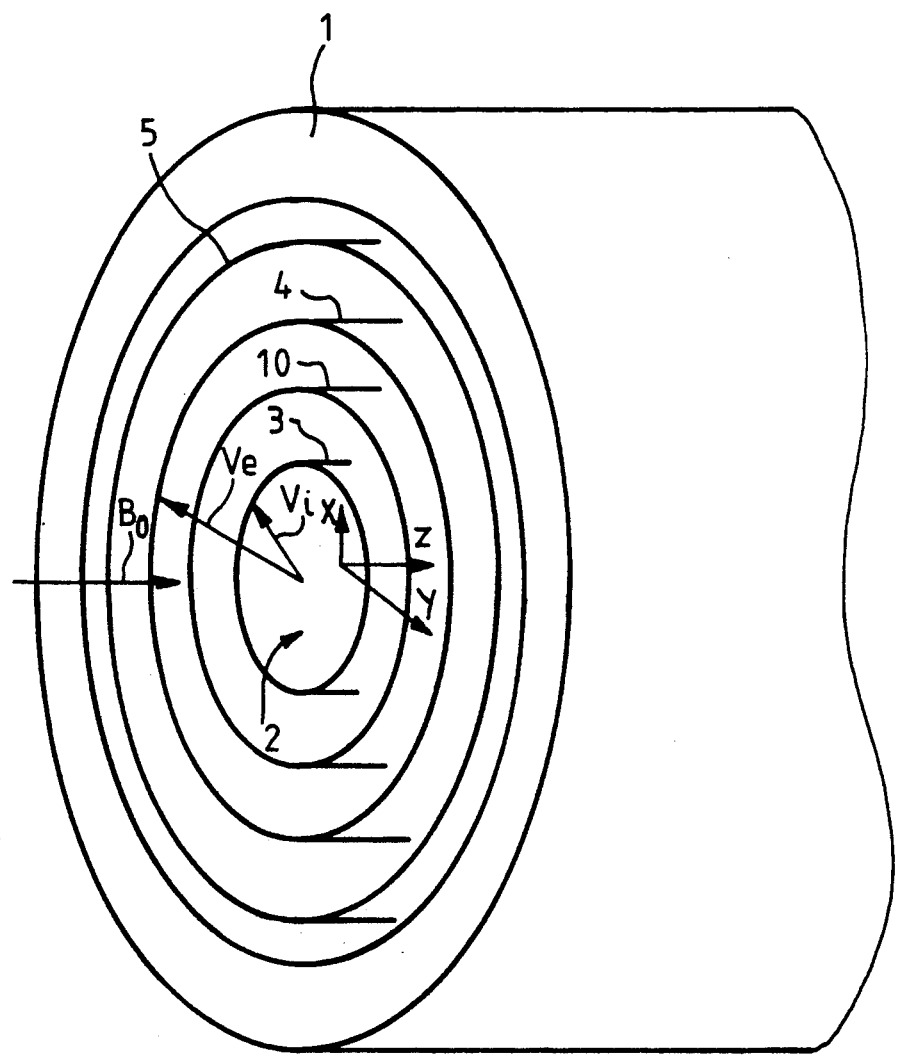
FIG_1

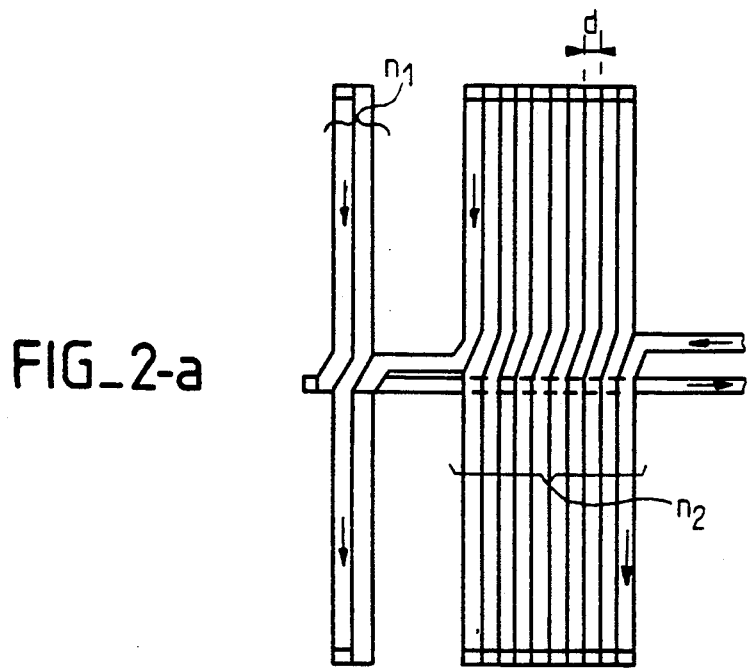
FIG_2-a
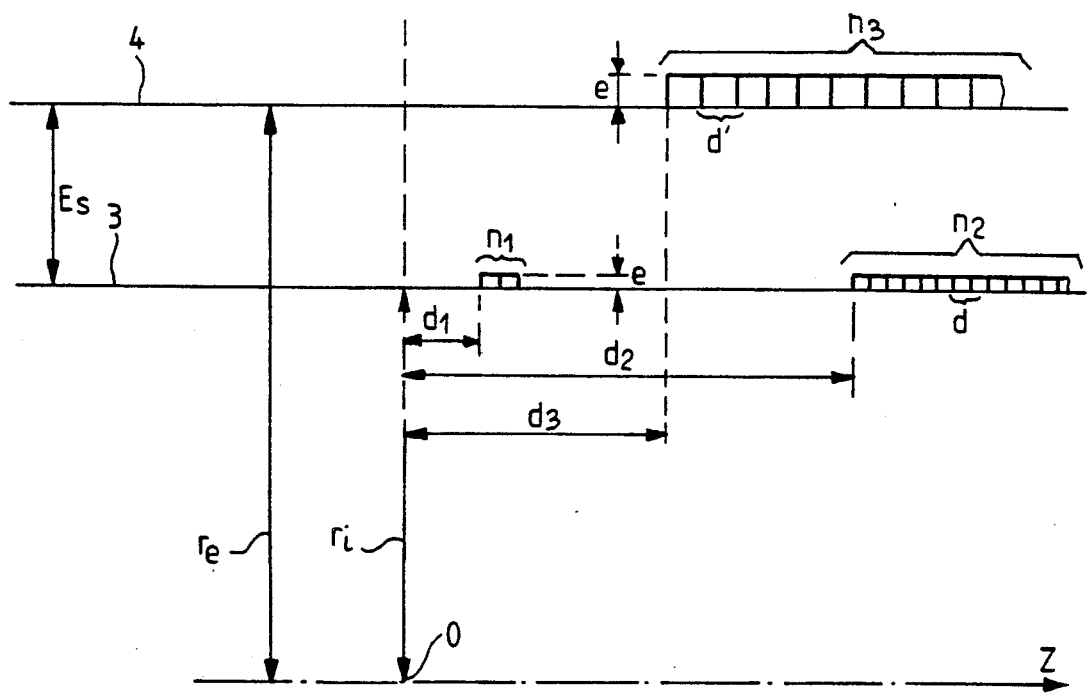
FIG_2-b

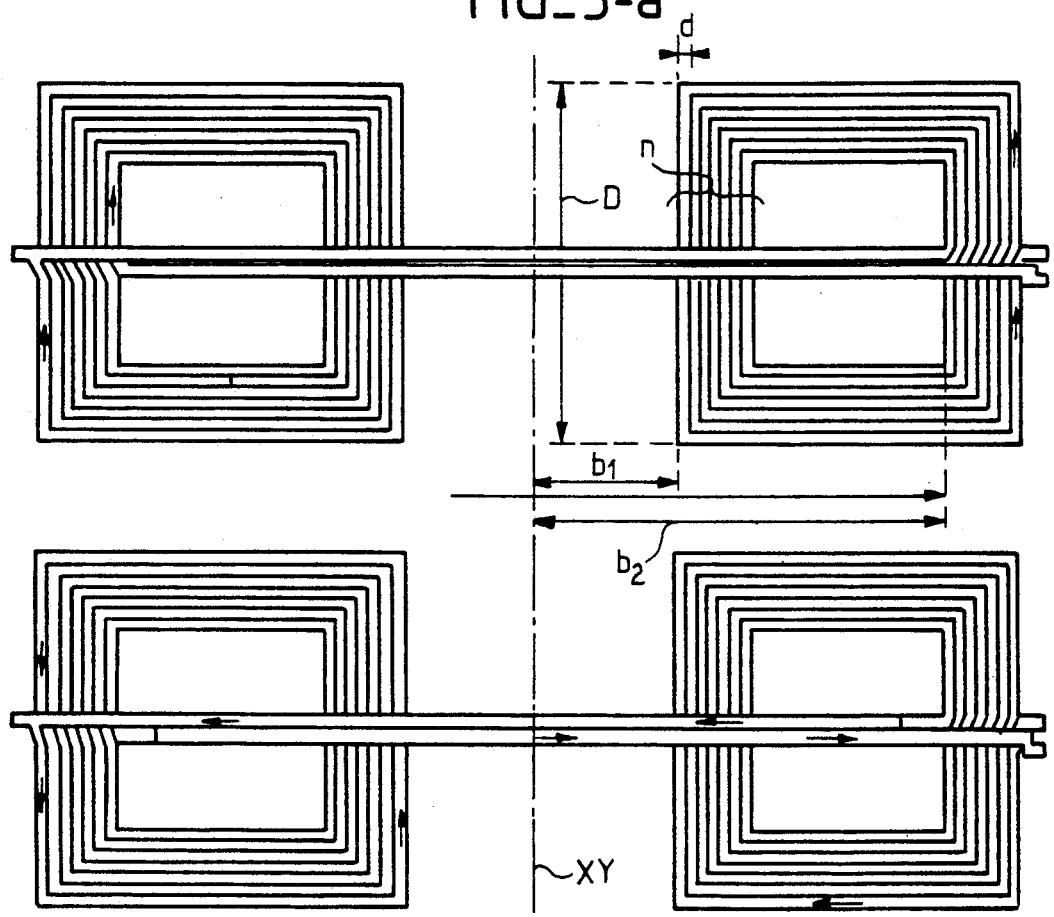
FIG_3-a
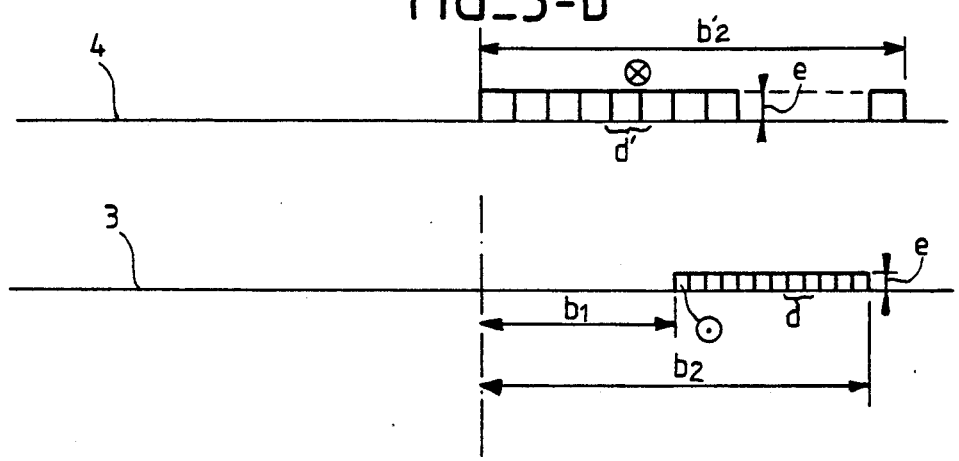
FIG_3-b

GRADIENT COIL SYSTEM FOR NMR MACHINES

An object of the present invention is a system of gradient coils for nuclear magnetic resonance (NMR) machines. It is due to the collaboration of the *Service National des Champs Intenses* (Director: Mr. Guy AUBERT). This system of gradient coils is designed to create a magnetic field gradient in a volume of interest of an NMR instrument. The invention can be applied more particularly in the medical field where imaging by nuclear magnetic resonance is unanimously recognized as a diagnostic aid. It can clearly be implemented in other fields. The aim of the present invention is to contribute to the creation of images, of a body to be examined, that are more faithful as well as more precise in their resolution.

A nuclear magnetic resonance imaging instrument essentially has three types of coils. Coils of a first type (which may be replaced, as the case may be, by permanent magnets) are designed to create an intense, homogeneous magnetic field $B_0$ in a predetermined field of interest. Coils of a second type, called a radio-frequency coils, are aimed at subjecting a body, examined and placed under the influence of the field of the first coils, to radio-frequency excitation sequences, and to measure a radio-frequency signal re-emitted in return by particles of the body following the excitation. The radio-frequency response is a response in volume: all the particles of a region of the body subjected to the examination emit their radio-frequency response at the same time. To create an image, these responses have to be differentiated. To this end, the imaging instruments have coils of a third type, called gradient coils, to superimpose additional magnetic fields on the intense homogeneous field. The value of these fields depends on the spatial coordinates of their place of application. In standard practice, it is proposed to organize this differentiation along three orthogonal axes X, Y, Z. By convention, the axis Z is even generally taken to be colinear with the intense field created by the first type of coils. In other words, each location of space may be encoded at a different field value: the modifications resulting therefrom in the re-emitted signal are exploited to create the image.

Gradient coils are generally divided into three classes: those that create a gradient along X, those that create a gradient along Y and those that create a gradient along Z. For example, a magnetic field gradient along X is a magnetic field for which the distribution of the component colinear to the intense field (Z), in space, is a function solely of the coordinate $x_i$ of its place of application. In practice, it is preferably even proportionate thereto. This means that all the particles of a body to be examined, located in a plane parallel to Y-Z and with a given abscissa $x_i$, are subjected to one and the same total field $B_0+G_x.x_i$. The gradient $G_x$ is the slope of the variation of the component along Z of the additional field provided by these gradient coils X.

The acquisition of an image thus requires the application of field gradient sequences in conjunction with the application of the radio-frequency excitation sequences. The field gradient sequences depend on the imaging method implemented. This method may be, for example, of the 2DFT type described by A. KUMAR and R. ERNST or, for example, of the back projection type prepared by P. C. LAUTERBUR. Irrespectively of the type of imaging chosen, one characteristic of the field gradients is that they are pulsed. They are set up, they persist for a short duration, then they are cut off. This may occur one or more times during each sequence. The consequence of this particular feature is that the working of the coils that produce them must be studied not only in permanent operation, during the application of the gradients, but also during the transient phenomena resulting from their being set up and their being cut off.

Another major characteristic of the field gradients concerns their homogeneity. Homogeneity means the condition where a real field gradient conforms, with a given tolerance, to an ideal theoretical distribution that is to be laid down. In effect, field non-homogeneities have the consequence of falsifying the differentiation which it is sought to impose in space and which is the very basis of imaging. From this viewpoint, problems of homogeneity have to be resolved as much with respect to the gradients as they may be with respect to the intense homogeneous fields. In a previous French patent application No. 85 15510, filed on Oct. 18, 1985 by the same Applicant, a solution has been provided to the contradictory problem raised by the making of coils that are as large as possible to produce gradients that are as homogeneous as possible while, at the same time, being as small as possible to reduce their self-inductance and thus reduce the power that has to be provided to set up these additional magnetic fields. An indication is given therein of how, for a given location, it is possible to find gradient coils producing optimized gradients that are sufficiently strong and homogeneous and having low self-inductance.

However, while gradient coils, also called gradients, formed in this way work to perfection intrinsically, they show drawbacks when they are actually placed in the NMR machines that they are supposed to outfit. For, in order to be capable of producing a uniform magnetic field $B_0$ that is sufficiently strong (or the order of 0.5 to 1.5 tesla), the NMR machines have coils of a first type, made by means of a so-called superconductor technology. The intense electrical current that flows through the conductors of the superconductive coils of a magnet thus formed encounters no ohmic resistance. In principle, it is possible to raise it to a level determined by the characteristics of the material used, and obtain a desired field $B_0$. It is only necessary to keep the interior of the chamber in which these conductors are contained at a temperature of superconductivity. Notably, it necessary to prevent the environment outside this chamber, which is at ambient temperature, from heating this interior space. In view of a given degree of thermal insulation of the interior of the chamber from the surrounding environment, cooling devices for which the cooling capacity is calculated are used for magnets such as these.

However, two types of accident may occur. Firstly, the cooling device may go out of order, and secondly the integrity of the chamber may get damaged and the cooling capacity necessary may become greater than that which the cooling device is capable of giving it. In both cases, the interior of the chamber gets heated and the conductors, through which flows the electrical current that creates the uniform field $B_0$, lose their superconductivity. In losing their superconductivity, they become resistant. Under the effect of this resistance and of the current that flows through them, they are themselves the site of a sudden creation of heat by Joule effect. This heat produced thus contributes to heating the interior of the chamber. Continuing thus, the phenomenon keeps growing bigger. The result of this chain reaction that occurs is that the uniform magnetic field created tends to collapse since the inducing electrical current decreases. This collapse is sudden because of the chain reaction. A magnet that loses its characteristics in this way is said to get "quenched". Now, by Maxwell's equations, the sudden variation of the magnetic field $B_0$ causes the rise of an induced electrical field.

If the field $B_0$ is longitudinal inside the tunnel of the magnet, it may be said that the electrical field that develops therein at the time of this collapse is looped back on itself in circles of different diameters, coaxial to the axis (Z) of the tunnel of the machine. Some of these circles naturally develop in the very center of the zone of interest of the NMR machine, where a patient under examination is supposed to be. In this patient, this electrical field gives rise to an electrical current which may seriously injure him. To prevent the risk of death to which this patient is thus subjected, it has become usual to set up, inside the magnet and on the periphery of the examination tunnel, an electrically conductive metal screen which is supposed to offer the induced electrical field, created by the collapse of the continuous magnetic field, a very low impedance as compared with the impedance of air, on the one hand, and the impedance of the examined patient's body, on the other hand. As a result, the energy released by the established field $B_0$ which collapses is preferably absorbed by this screen rather than by the patient's body. Thus, at the instant of such a collapse, this screen becomes the site of very intense eddy currents which naturally cause it to get heated up but then develop only to a comparatively very slight extent in the body being examined. This screen is also aimed at shielding the superconductive magnet from the electromagnetic disturbances generated in the internal volume by the imaging process.

The advantage provided by the presence of such a screen is, on the contrary and by virtue of the same principles of physics, harmful to the setting up and cutting off of the pulsed gradients. For, the variation in the continuous magnetic field caused when the gradient pulses are set up or cut off results in an induced electrical field which develops in the form of eddy currents in the protection screen. These eddy currents then tend, in a known way, to counter the setting up of the additional gradient magnetic field thus desired. The result thereof is that the gradients set up do not immediately reach the value assigned to them. The result of this defect is complex.

On the one hand, the space of interest cannot be considered to be linear in the entire space of interest. For, the eddy currents react differently on the different regions of the space of interest. This has two consequences per se. Firstly, the greater the distance from a central image zone, the weaker is the gradient with respect to a nominal value. This ultimately leads to a geometrical distortion of the images obtained which, possibly, may be acceptable. For, if it is accepted that the images obtained will not be used for the absolute shape of the contours that they reveal, these images may be used to prepare a diagnosis, for example to detect the presence of tumours near organs that it would be possible to recognize. By contrast, for surgical operations which might possibly be conducted with the assistance of robots, this geometrical distortion would have to be corrected. However, this non-linearity of the gradient leads to another serious consequence in the zones distant from the central zone. In effect, the variation of the gradient leads to a modification in the size of elements of volume taken into account in the discrete computations for the reconstruction of images. This variation in size leads to a varation in the amplitude of the corresponding signal detected. Since imaging relies on the measurement of the amplitude of the signals received, this might mean that, owing to a defect in contrast, the presence of tumours which, precisely, are to be detected, might not be seen.

In addition to these defects, it must be noted that the eddy currents themselves produce a contrary magnetic field (which counters the additional gradient field) that has the disadvantage of not being distributed homogeneously in the space of interest. In other words, not only is the desired gradient value not achieved, a situation to which a correction might be attempted were it to be known with exactness, but moreover its homogeneity is destroyed. It must be further noted that the degradation in the value of the gradient and the destruction of its homogeneity are, during the gradient pulse itself, only temporary. For, as soon as the effects of the eddy currents have finally made themselves felt, the value and the homogeneity of the field for which the gradient coils have been computed intrinsically may be obtained again. Apart from the conductive screen, the role and drawbacks of which have just been discussed, the cryogenic techpique associated with superconductive magnets requires the installation of various conductive casings (cryostat walls, radiation screens) wherein also eddy currents develop.

In the prior art, it was sought to overcome this drawbacks in various ways. In a first technique, called the "overshoot" technique, it was sought to overcome the deficit in the value of the gradient at the time of its application by the application of a pulse of current far stronger at the start of this pulse than during the holding of this pulse. This technique, which has given partial satisfaction, has however two drawbacks. Firstly, the values of current overshooting are very high. In practice, they attain 30 to 40% of the nominal value of the current needed to maintain the planned gradients. The electrical supplies that supply the gradient coils should therefore be capable of temporarily bearing this additional flow of current. At the power values brought into play (of the order of 30 to 40 KW), these technologies cannot be easily mastered. Secondly, just as much as, with this temporary overshooting of current, it is possible to overcome the deficits in level of the gradient applied, so with the additional eddy current that this overshooting itself causes, there results an additional destruction of the homogeneity of the gradient of the field created. In practice, a compromise has always been sought between these two requirements.

More recently, in an U.S. Pat. No. 4 647 848 filed on Jul. 29, 1985 and delivered on Mar. 3, 1987, another technique, known as "overcoming" was proposed. In this technique, each pulse gradient of an imaging process is followed by gradient pulses on the other axes. These pulses tend to wipe out the harmful effects of the eddy currents on the homogeneity of the pulsed useful gradient In a way, and somewhat as in the so-called spin echo technique used to overcome the homogeneities of the main field $B_o$, this technique thus causes an echo of eddy currents which, it is hoped, will precisely cancel out the harmful effects of the eddy currents arising when the useful gradient pulse is set up and cut off. However, the technique can only be implemented experimentally. And the complexity of the phenomenon brought into play makes it a painstaking task to seek a solution for which, moreover, it is never known whether it is the most efficient one that can be obtained.

Closer to us, in the annual report for July 1985 to June 1986 of the Francis Bitter National Magnet Laboratory, Massachussets Institute of Technology, pages 50 to 51, it is proposed to make gradient coils in a double form including, for each gradient coil, an inner coil (itself containing the examination space) surrounded by an external coil in such a way that the "superimposition of the two resultant fields is a field of zero amplitude outside the external coils". And it is even deduced, since at the moment of the application of the gradient pulses, no change takes place in the field in the region external to this set of coils, that "no eddy current occurs". This is false. Even if the field could be maintained at zero throughout the space external to the set of the two coils which, as we shall see further below, is impossible, it cannot be deduced therefrom that the screen which, for its part, is effectively outside this set, will not be the site of troublesome eddy currents.

For, in a simple example, when a turn is formed, it is not because there is no magnetic field at the conductor of the turn that the magnetic field which which passes into the interior of this turn is itself at zero. And hence the variation in this internal magnetic field induces a current in the turn. As it happens, here the magnetic gradient field created inside the examination zone is, of course, not at zero because it is precisely this field that it is sought to create. Consequently, inside the screen, at the moment of the application of the gradient pulses, an additional magnetic field arises. As a consequence, the entire screen that surrounds this region of examination where the field has been created is inevitably the site of feedback eddy currents even if the field, by the contrivance of an additional gradient coil, has been cancelled at this screen.

An object of the present invention, however, is to overcome these drawbacks by proposing a solution that does not make use of the technique using additional current at the time of the driving of the pulse of the gradient, which is a definitive solution related solely to the structure of the gradient coils themselves, and is therefore independent of one particular type of gradient pulse or another. In the invention, it is shown that, at the screen, it is not a zero magnetic field that must be obtained but rather a zero magnetic vector potential.

The invention therefore concerns a system of so-called compensated coils for NMR machines, to remove the effects of eddy currents at preferred zones of the machine, characterized in that it comprises means so that the magnetic vector potential attached to these gradient coils is reduced to the minimum in these preferred zones. In practice, the preferred zones may be the screen, or any other part of the space of an NMR machine where harmful eddy currents may develop when the gradient pulses are applied. In particular, in NMR machines with permanent magnets, the metal structures holding the ferromagnetic pieces as well as these pieces themselves, if they are conductive, could form the preferred zones where the rise of the eddy currents would have to be curbed.

The invention will be understood more clearly from the reading of the following description and from the examination of the Figures that accompany it. These have been given purely by way of indication and in no way restrict the scope of the invention. The Figures show:

FIG. 1, a system of gradient coils according to the invention;

FIGS. 2a and 2b, a particular exemplary embodiment of Z type compensated gradient coils;

FIGS. 3a and 3b: a particular exemplary embodiment of X type or Y type compensated gradient coils.

FIG. 1 shows a system of coils according to the invention. An NMR machine therein essentially has a magnet to produce an intense and continuous homogeneous field $B_0$ inside a zone 2 of examination. In addition, the machine has electromagnetic excitation and imaging devices, not shown. The machine has a system of gradient coils including a first gradient mandrel 3, called an internal mandrel, in direct contact with the region 2, and a second gradient mandrel 4 external to the mandrel 3. The gradient mandrels are mandrels that carry the gradient coils. At a preferred zone, formed in the example by the location of a screen 5, the magnetic fields given by the gradient mandrels 3 and 4, when they are supplied with electrical pulses, are such that the magnetic vector potential therein is reduced to the minimum and is even, therein, as far as possible at zero.

When the gradient pulses are applied to the gradient coil conductors mounted on the gradient mandrels 3 and 4, an induced electrical field E is produced in the entire space. The mathematical formulation of this field $\bar{E}$ may be given as follows:

$$rho\ E = rho\ B\ rho\ t$$

This may be also written as:

$$E = rho\ A\ rho\ t$$

where $\bar{E}$ is the induced electrical field, $\bar{B}$ is the inducing magnetic field and $\bar{A}$ is the magnetic vector potential such that:

$$B = rho\ A$$

In the invention it has been realised, on the scale of the periods of time for which the work is done, that the propagation phenomena do not have to be taken into account. For, the build-up and cut-off times of the field gradient pulses are typically of the order of 0.1 to 1 millisecond. During this period, at the speed of propagation of light, it may be assumed that at any place in the space of the NMR machine (of the order of 3 or 4 meters at the maximum) the vector potential may be written as follows:

$$A = U(x,y,z) \cdot (g(t))$$

This formulation shows that the space and time variables can be separated in this case. Since it is sought to cancel E in a certain number of preferred zones of the space, this amounts to cancelling the following expression:

$$E = -rho\ A\ rho\ t = -U(x,y,z) \cdot (g(t))$$

Since it is impossible to cancel the derivative g'(t) since g(t) represents precisely the desired pulsed variation of the gradient, all that remains is to cancel the value of U for all values of x y z belonging to the preferred zone. By thus cancelling the vector potential on the screen, or at least by reducing it to the minimum, the rise of the disturbing eddy currents therein is reduced to the minimum since the electrical field induced therein would be reduced to the minimum. Since the screen or the conductive cases are generally of small thickness with respect to their dimension, it is enough to cancel the component of the vector potential in the tangential at each point of the screen or of the casing. In other words, in the invention, it has been possible to show that it is enough to cancel the tangential component of the static vector potential without resorting to means depending on time such as those implemented in the overshoot technique or the overcoming technique.

In a particular embodiment, the gradient mandrels will be of the type described in the above-mentioned French patent application. Each mandrel has gradient coils to produce field gradients oriented along the axes X, Y and Z. This patent application gave an indication of how to compute homogeneous gradient coils with a given order of homogeneity if liberty of action were retained as regards the thicknesses, number and positions of the useful conductor wires of the gradient coils to be created. For the type Z gradient coils, the useful strands are in the shape of circles; for the X or Y type gradients, these useful strands are formed by portions of circle arcs with given angular aperture. It is possible to compute the field and the magnetic vector potential created by each of these gradient coils. With the magnetic vector potential created by these gradient coils being known, it is possible to compute the electrical field induced by the variation of the magnetic field at the preferred zones, for example at the intended position of the screen 5. By adding on another gradient coil of a given type, placed on an external mandrel and corresponding, each time, to a gradient coil of one and the same given type (X, Y, Z) placed on the internal mandrel, it is possible also to compute the electrical field produced under the same conditions. In particular, the coils are supplied with one and the same current by arranging to place the gradient coils of the two mandrels in series, at least at the moment of the application of the gradient pulses. By stipulating an internal radius $r_i$ and an external radius $r_e$ for the mandrels 3 and 4 respectively, it is possible, by standard methods of electromagnetism and by varying the number and position of the useful conductors in each of the gradient coils, to determine the optimum distribution of these conductors for which the potential of the vector A is thus cancelled or at least reduced to the minimum.

FIGS. 2a and 2b as well as 3a and 3b give examples of embodiments of Z and X or Y type gradient coils respectively having, with the values assigned by the tables and 2, the above-mentioned advantages. FIGS. 2a and 3a are Figures of gradient coils deployed after longitudinal opening of the mandrel that bears them. FIGS. 2b and 3b show partial diameter sections of the mandrels. The Z type gradient coils of FIG. 2a normally have a ring shape. The X or Y type gradient coils of FIG. 3a are normally saddle-shaped coils. A description of the making of these coils, their association on a mandrel and their electrical supply is given in the above-mentioned patent application. In a particular examplary embodiment, the gradient coils Z have the characteristics given in the following table 1:

TABLE 1

| Z | r | e | $n_1$ | $n_2$ | $n_3$ | d | d' | $d_1$ | $d_2$ | $d_3$ |
|---|---|---|---|---|---|---|---|---|---|---|
| internal | 0.386 | 0.003 | 2 | 22 | — | 0.0165 | — | 0.051 | 0.248 | — |
| external | 0.481 | 0.003 | — | — | 14 | — | 0.036 | — | — | 0.177 |

All the dimensions are given in meters. In these Figures and in the table 1, r designates the internal radius of a mandrel which would mechanically support the gradient coils to be built; e represents the thickness measured radially to the examination zone 2 of the conductors used, $n_1$ is the number of rings on the internal mandrel 3 of a packet of attached rings which are closest to the central part 0 of the region 2; $n_2$ is the number of rings, on the internal mandrel 3, of a packet of attached rings located in the rear of the central region 0; and $n_3$ represents a number of rings of a packet located on the external mandrel 4. It has been realised that, preferably, $n_3$ should be an intermediate number between $n_1$ and $n_2$. The magnitudes d and d' indicate the widths, measured longitudinally, of the conductors of the rings. Preferably, d' is greater and is substantially equal to twice d. The magnitudes $d_1$, $d_2$ and $d_3$ are the abscissae, measured along the axis Z, of the first rings, respectively, of each of the packets of $n_1$, $n_2$ and $n_3$ rings. In the same way it has been realized, in the invention, that the most efficient solution was obtained for a value of $d_3$ intermediate between $d_1$ and $d_2$.

As regards X or Y type gradients, the values of the saddle-shaped conductors of the coils of these gradients are given by the following table 2.

TABLE 2

| X or Y | r | e | d | d' | $n_1$ | $n_2$ | $b_1$ | $b_2$ | D |
|---|---|---|---|---|---|---|---|---|---|
| internal | 0.391 | 0.003 | 0.016 | — | 22 | — | 0.0439 | 0.7479 | 0.49 |
| external | 0.486 | 0.003 | — | 0.0345 | — | 10 | 0.000 | 0.8333 | 0.63 |

It has been realised that, for the X or Y gradients, a better compensation is obtained with a number $n_2$ of useful conductors in the external mandrel that is smaller than the number $n_1$ of useful conductors in the internal mandrel. Better still, a greater conduction width d' is chosen, for example one that, in the external mandrel, is twice the conduction width d in the internal mandrel.

It is worthwhile to note that, with the structure thus presented, it has been possible to obtain setting-up and cut-off times of the order of 0.1 m/s (instead of 1 m/s) with an error of the order of 1% in the value of the gradient obtained or, again, an error of the order of 0.05% if the build-up time is kept at one millisecond, whereas it was of the order of 40% in the prior art referred to and whereas a major overshoot of 40% also did not enable the situation to be restored correctly in the entire volume of interest.

Furthermore, in a preferred way, the two mandrels are moved away from each other to the maximum extent, and the vacant place between them is used to place therein a mandrel 10 of coils for the correction of the homogeneity of the main field $B_0$ (FIG. 1).

What is claimed is:

1. Method for the compensation of the magnetic effects of the eddy currents in predetermined zones of an NMR machine provided with a system of gradient coils said to be compensated because said gradient coils are designed to eliminate the magnetic effects of the eddy currents, characterized in that said method comprises a step for the adjusting of the current in these coils so that a magnetic vector potential (A) created by said system of gradient coils or one of the components is reduced to a minimum in said predetermined zones, said components of said magnetic vector potential being geometrical components.

2. Method according to claim 1 characterized in that the location of the determined zones is chosen so that they are located where there is placed a screen for damping the effects of collapse of a magnetic field ($B_0$) of the NRM machine or a casing of a cryogenic device.

3. Method according to the claim 1 or the claim 2, characterized in that, for the minimizing, two layers of gradient coils are created in the system.

4. Method according to the claim 3, characterized in that the layers are made on two gradient mandrels with different radii, respectively called internal and external radii because one of them is inside the other.

5. Method according to claim 3, characterized in that the two layers are spaced out sufficiently from each another to place, between them, coils for the correction of the main magnetic field of the NMR machine.

6. Method according to claim 4, wherein gradient coils are made including, on each mandrel, at least two packets of useful conductors each having a given number of conductors, characterized in that a number of useful conductors in a packet of conductors of the external mandrel is intermediate between the numbers of useful conductors of the packets of conductors placed on the internal mandrel.

7. Method according to claim 4 wherein the conductors of gradient coils of a given type are placed on an interior gradient mandrel, characterized in that these conductors are chosen so that they present conduction sections that are smaller than the conduction sections of the conductors of gradient coils of the same type and are located on an external mandrel.

8. Method according to claim 3, characterized in that the gradient coils of one and the same type, located on two different layers, are supplied in series.

9. Method according to claim 4 wherein the system has Z type radiant coils distributed, on each of the internal and external gradient mandrels, in packets of conductors, characterized in that the abscissae measured along the axis Z of the first conductors of the packets of conductors of gradient coils placed on the internal mandrel are respectively smaller and greater than the abscissa of the first conductor of a packet of conductors placed on the external mandrel.

10. Method according to claim 4 characterized in that coils are made in accordance with the following characteristics:

| Z | r | e | $n_1$ | $n_2$ | $n_3$ | d | d' | $d_1$ | $d_2$ | $d_3$ |
|---|---|---|---|---|---|---|---|---|---|---|
| internal | 0.386 | 0.003 | 2 | 22 | — | 0.0165 | — | 0.051 | 0.248 | — |
| external | 0.481 | 0.003 | — | — | 14 | — | 0.036 | — | — | 0.177 |

| X or Y | r | e | d | d' | $n_1$ | $n_2$ | $d_1$ | $d_2$ | D |
|---|---|---|---|---|---|---|---|---|---|
| internal | 0.391 | 0.003 | 0.016 | — | 22 | — | 0.0439 | 0.7479 | 0.499 |
| external | 0.486 | 0.003 | — | 0.0345 | — | 10 | 0.000 | 0.8333 | 0.639 | where:
XYZ designates the type of gradient coil concerned,
r designates the value in meters of the internal radius of a mandrel,
e designates the value in meters of the radially measured thickness of the conductors used to form the coils,
$n_1$ represents the number of conductors in the respective packets,
d and d' indicate the value in meters of the widths measured longitudinally,
$d_1$ are the abscissae in meters of the packets of conductors.

* * * * *